United States Patent
Li et al.

(10) Patent No.: US 11,081,081 B2
(45) Date of Patent: Aug. 3, 2021

(54) COLOR GAMUT CONVERSION METHOD, COLOR GAMUT CONVERTER, DISPLAY DEVICE, IMAGE SIGNAL CONVERSION METHOD, COMPUTER DEVICE AND NON-TRANSITORY STORAGE MEDIUM

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Yue Li, Beijing (CN); Tiankuo Shi, Beijing (CN); Zhihua Ji, Beijing (CN); Chuan Shuai, Beijing (CN); Lingyun Shi, Beijing (CN); Xiaomang Zhang, Beijing (CN); Yifang Chu, Beijing (CN); Chengqi Zhou, Beijing (CN); Chuanjun Liu, Beijing (CN); Zhou Sun, Beijing (CN); Yilang Sun, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/633,925

(22) PCT Filed: Jun. 12, 2019

(86) PCT No.: PCT/CN2019/090956
§ 371 (c)(1),
(2) Date: Jan. 24, 2020

(87) PCT Pub. No.: WO2019/238071
PCT Pub. Date: Dec. 19, 2019

(65) Prior Publication Data
US 2020/0175943 A1 Jun. 4, 2020

(30) Foreign Application Priority Data
Jun. 15, 2018 (CN) .......................... 201810619240.8

(51) Int. Cl.
G09G 5/02 (2006.01)
H04N 1/60 (2006.01)
(Continued)

(52) U.S. Cl.
CPC ......... *G09G 5/02* (2013.01); *G09G 2360/145* (2013.01)

(58) Field of Classification Search
CPC combination set(s) only.
See application file for complete search history.

(56) References Cited

U.S. PATENT DOCUMENTS 8,384,653 B2   2/2013 Kim et al.
9,378,705 B2   6/2016 An et al.
(Continued)

FOREIGN PATENT DOCUMENTS

CN   101378514 A   3/2009
CN   104376833 A   2/2015
(Continued)

OTHER PUBLICATIONS

Yao Hongtao et al., "A Modified RGB to RGBW Signal Mapping Algorithm", Journal of Changchun University of Science and Technology (Natural Science Edition), China Academic Journal Electronic Publishing House, vol. 41, No. 1, Feb. 28, 2018, pp. 120-122 and 126 with English translation (9 pages).
(Continued)

*Primary Examiner* — Wesner Sajous
(74) *Attorney, Agent, or Firm* — Collard & Roe, P.C.

(57) ABSTRACT

A color gamut conversion method, a color gamut converter, a display device, an image signal conversion method, a
(Continued)

computer device and a non-transitory storage medium are disclosed. The method includes: acquiring RGB signals and a preset grayscale value of a white subpixel in each pixel of a converted image according to grayscale values of monochromatic subpixels in each pixel of an original image corresponding to the RGB signals, the converted image is obtained by converting the original image from an RGB gamut to an RGBW gamut; and acquiring a target grayscale value of the white subpixel at least according to a first maximum grayscale of the white subpixels and the preset grayscale. As for a first saturation color patch in the original image, a first maximum grayscale of a white subpixel corresponding to each pixel in the first saturation color patch is equal to a grayscale threshold.

19 Claims, 7 Drawing Sheets

(51) Int. Cl.
  *H04N 5/202* (2006.01)
  *H04N 9/64* (2006.01)
  *G06T 11/00* (2006.01)

(56) References Cited

U.S. PATENT DOCUMENTS

| | | | |
|---|---|---|---|
| 9,818,333 B2 | 11/2017 | Li et al. | |
| 2012/0019879 A1* | 1/2012 | Aronoff | G06K 19/06028 358/505 |
| 2013/0106901 A1* | 5/2013 | Inada | G09G 5/026 345/600 |
| 2015/0035847 A1* | 2/2015 | Park | G09G 3/3225 345/589 |
| 2015/0371124 A1* | 12/2015 | Okumura | G06K 15/1878 358/1.9 |
| 2016/0019851 A1* | 1/2016 | Chen | G09G 3/3607 345/89 |
| 2016/0117975 A1* | 4/2016 | Kang | G09G 3/2074 345/694 |
| 2016/0125622 A1* | 5/2016 | Kim | G06T 5/009 345/690 |
| 2016/0140924 A1* | 5/2016 | Heo | G09G 3/2003 345/690 |
| 2016/0260393 A1* | 9/2016 | Chen | G09G 3/3685 |
| 2016/0343283 A1* | 11/2016 | He | G09G 3/2003 |
| 2018/0158394 A1* | 6/2018 | Guo | G09G 3/20 |
| 2020/0175943 A1 | 6/2020 | Li et al. | |

FOREIGN PATENT DOCUMENTS

| | | |
|---|---|---|
| CN | 105263009 A | 1/2016 |
| CN | 108810507 A | 11/2018 |

OTHER PUBLICATIONS

International Search Report of PCT/CN2019/090956 in Chinese, dated Aug. 26, 2019, with English translation.

* cited by examiner

COLOR GAMUT CONVERSION METHOD, COLOR GAMUT CONVERTER, DISPLAY DEVICE, IMAGE SIGNAL CONVERSION METHOD, COMPUTER DEVICE AND NON-TRANSITORY STORAGE MEDIUM

CROSS REFERENCE TO RELATED APPLICATIONS

This application is the National Stage of PCT/CN2019/090956 filed on Jun. 12, 2019, which claims priority under 35 U.S.C. § 119 of Chinese Application No. 201810619240.8 filed on Jun. 15, 2018, the disclosure of which is incorporated by reference.

TECHNICAL FIELD

Embodiments of the present disclosure relate to a color gamut conversion method, a color gamut converter, a display device, an image signal conversion method, a computer device and a non-transitory storage medium.

BACKGROUND

With the continuous development of display technology, display devices have been widely used in electronic products, such as mobile phones, televisions, and computers. At present, with the continuous improvement of the resolution of three-primary-color (RGB) display devices, the aperture ratio of pixels is getting smaller and smaller, and the display brightness is decreased. For example, the display quality of the three-primary-color (RGB) display device can be improved through adding white (W) subpixels into pixels.

SUMMARY

At least one embodiment of the present disclosure provides a color gamut conversion method, which comprises: acquiring RGB signals; acquiring a preset grayscale value of a white subpixel in each pixel of a converted image according to grayscale values of monochromatic subpixels in each pixel of an original image corresponding to the RGB signals, in which the converted image is obtained by converting the original image from an RGB gamut to an RGBW gamut; and acquiring a target grayscale value of the white subpixel at least according to a first maximum grayscale of the white subpixels and the preset grayscale value, and allowing the target grayscale value of the white subpixel to be less than or equal to a minimum value of the first maximum grayscale of the white subpixel and the preset grayscale value, in which, as for a first saturation color patch in the original image, a first maximum grayscale of a white subpixel corresponding to each pixel disposed in the first saturation color patch is equal to a grayscale threshold, and the grayscale threshold is less than a maximum grayscale value allowed by a display device.

For example, in at least one example of the color gamut conversion method, a first maximum grayscale of a white subpixel corresponding to each pixel, which is disposed in the original image and at outside of the first saturation color patch, is equal to the maximum grayscale value allowed by the display device; and the maximum grayscale value allowed by the display device is equal to 255, and the grayscale threshold is selected from 90-110.

For example, in at least one example of the color gamut conversion method, the color gamut conversion method further comprises: dividing the original image into at least one detection area; and determining whether a detection area of the at least one detection area is the first saturation color patch according to brightness, saturations and hues of a plurality of pixels in the each detection area.

For example, in at least one example of the color gamut conversion method, the dividing the original image into the at least one detection area and determining whether the detection area of the at least one detection area is the first saturation color patch according to the brightness, saturations and hues of the plurality of pixels in the detection area comprises: setting a preset saturation threshold, a preset hue range, a preset brightness threshold and a first preset proportion parameter; acquiring a proportion of pixels in the detection area, of which saturations are greater than the preset saturation threshold, hues are within the preset hue range, and brightness is greater than the preset brightness threshold, in all pixels of the original image; and determining that the detection area is the first saturation color patch when the proportion is greater than the first preset proportion parameter.

For example, in at least one example of the color gamut conversion method, the color gamut conversion method further comprises: setting a second preset proportion parameter; acquiring a proportion K of pixels in the original image, of which saturations are greater than the preset saturation threshold, in all the pixels of the original image; and taking K×255 as a second maximum grayscale of the white subpixel when the proportion K is greater than the second preset proportion parameter. The acquiring the target grayscale value of the white subpixel at least according to the first maximum grayscale of the white subpixel and the preset grayscale value and allowing the target grayscale value of the white subpixel to be less than or equal to the minimum value of the first maximum grayscale of the white subpixel and the preset grayscale value comprises: taking a minimum value of the first maximum grayscale, the preset grayscale value and the second maximum grayscale as the target grayscale value of the white subpixel.

For example, in at least one example of the color gamut conversion method, before acquiring the proportion K of the pixels in the original image, of which the saturations are greater than the preset saturation threshold, in all the pixels of the original image, the method further comprises: acquiring a saturation of each pixel of the original image and normalizing the saturation of the each pixel.

For example, in at least one example of the color gamut conversion method, the color gamut conversion method further comprises: acquiring a grayscale value of red subpixel $R1i$, a grayscale value of green subpixel $G1i$, and a grayscale value of blue subpixel $B1i$ of each pixel in the RGBW gamut according to a grayscale value of red subpixel $Ri$, a grayscale value of green subpixel $Gi$, and a grayscale value of blue subpixel $Bi$ of each pixel in the RGB gamut. $Ri$, $R1i$, $Gi$, $G1i$, $Bi$ and $B1i$ satisfy following formulas: $Ri=R1i$; $Gi=G1i$; $Bi=B1i$.

For example, in at least one example of the color gamut conversion method, the acquiring the preset grayscale value of the white subpixel in the each pixel of the converted image according to the grayscale values of the monochromatic subpixels in the each pixel of the original image corresponding to the RGB signals comprises: acquiring the preset grayscale value $W1i$ of the white subpixel according to a following formula:

$$W_{1i} = \frac{1}{3}(R_{1i} + G_{1i} + B_{1i}) \times \frac{\text{MIN}(R_{1i}, G_{1i}, B_{1i})}{\text{MAX}(R_{1i}, G_{1i}, B_{1i})}.$$

For example, in at least one example of the color gamut conversion method, the color gamut conversion method further comprises: converting a saturation of the each pixel of the original image into a value of the saturation to α-order power, in which 0<α<1; and acquiring target grayscale values of monochromatic subpixels in the each pixel of the converted image according to the converted saturation of the each pixel.

For example, in at least one example of the color gamut conversion method, after acquiring the target grayscale value of the white subpixel, the method further comprises: splicing data corresponding to the target grayscale value of the white subpixel and data corresponding to target grayscale values of monochromatic subpixels in a pixel same as the white subpixel, and generating RGBW signals.

For example, in at least one example of the color gamut conversion method, after generating the RGBW signals, the method further comprises: adjusting chromaticity coordinates of an image to be displayed corresponding to the RGBW signals according to chromaticity coordinates of a reference white pixel, so as to allow chromaticity coordinates of a white pixel to be overlapped with the chromaticity coordinates of the reference white pixel.

At least one embodiment of the present disclosure provides a computer device, which comprises a memory and a processor. Computer program instructions applicable to be executed by the processor are stored on the memory; and upon the processor running the computer program instructions, the processor executes a color gamut conversion method provided by any embodiment of the present disclosure.

At least one embodiment of the present disclosure provides a non-transitory storage medium, which comprises computer program instructions that are stored on the non-transitory storage medium; and upon a processor running the computer program instructions, a computer executes a color gamut conversion method provided by any embodiment of the present disclosure.

At least one embodiment of the present disclosure provides a color gamut converter, which comprises: a signal receiver, a grayscale value generator, a target grayscale determiner and a grayscale upper limit determiner. The signal receiver is configured to acquire RGB signals; the grayscale value generator is electrically connected with the signal receiver and configured to acquire a preset grayscale value of a white subpixel in each pixel of a converted image according to grayscale values of monochromatic subpixels in each pixel of an original image corresponding to the RGB signals, in which the converted image is obtained by converting the original image from an RGB gamut to an RGBW gamut; the target grayscale determiner is electrically connected with the grayscale upper limit determiner and the grayscale value generator and configured to acquire a target grayscale value of the white subpixel at least according to a first maximum grayscale of the white subpixel and the preset grayscale value so as to allow the target grayscale value of the white subpixel to be less than or equal to a minimum value of the first maximum grayscale and the preset grayscale value; and the grayscale upper limit determiner is configured to allow a first maximum grayscale of a white subpixel corresponding to each pixel disposed in a first saturation color patch to be equal to a grayscale threshold as for the first saturation color patch in the original image, in which the grayscale threshold is less than a maximum grayscale value allowed by a display device.

For example, in at least one example of the color gamut converter, the grayscale upper limit determiner is further configured to allow a first maximum grayscale of a white subpixel corresponding to each pixel, which is disposed in the original image and at outside of the first saturation color patch, to be equal to the maximum grayscale value allowed by the display device; and the maximum grayscale value allowed by the display device is equal to 255, and the grayscale threshold is selected from 90-110.

For example, in at least one example of the color gamut converter, the color gamut converter further comprises a color patch detector. The color patch detector is electrically connected with the grayscale value generator and configured to divide the original image into at least one detection area and determine whether a detection area of at least one detection area is the first saturation color patch according to the brightness, saturations and hues of a plurality of pixels in the detection area.

For example, in at least one example of the color gamut converter, the color gamut converter further comprises a saturation statistical device; the saturation statistical device is electrically connected with the signal receiver; the saturation statistical device is configured to acquire a proportion K of pixels in the original image, of which saturations are greater than a preset saturation threshold, in all pixels of the original image, and take K×255 as a second maximum grayscale of the white subpixel in the each pixel in the RGBW gamut when the proportion K is greater than a second preset proportion parameter; the grayscale upper limit determiner is further connected with the saturation statistical device and configured to take a minimum value of the first maximum grayscale and the second maximum grayscale as a grayscale upper limit of the white subpixel; and the target grayscale determiner is further connected with the grayscale upper limit determiner and configured to take a minimum value of the grayscale upper limit of the white subpixel and the preset grayscale value as the target grayscale value of the white subpixel.

For example, in at least one example of the color gamut converter, the color gamut converter further comprises a signal generator, a saturation adjuster and a first color space converter. The saturation adjuster is electrically connected with the signal receiver and configured to adjust a saturation of the each pixel of the original image to be a value of the saturation to α-order power, in which 0<α<1; the first color space converter is electrically connected with the saturation adjuster and configured to acquire target grayscale value of monochromatic subpixels in the each pixel of the converted image according to a converted saturation, which is outputted by the saturation adjuster, of the each pixel; and the signal generator is electrically connected with the target grayscale determiner and configured to splice data corresponding to the target grayscale value of the white subpixel and data corresponding to target grayscale values of monochromatic subpixels in a pixel same as the white subpixel, and generate RGBW signals.

For example, in at least one example of the color gamut converter, the color gamut converter further comprises a chromaticity coordinate adjuster; and the chromaticity coordinate adjuster is electrically connected with the signal generator and configured to adjust chromaticity coordinates of an image to be displayed corresponding to the RGBW signals according to chromaticity coordinates of a reference white pixel, so as to allow chromaticity coordinates of a white pixel in the image to be displayed to be overlapped with the chromaticity coordinates of the reference white pixel.

At least one embodiment of the present disclosure provides a display device, which comprises a color gamut converter provided by any embodiment of the present disclosure.

At least one embodiment of the present disclosure provides an image signal conversion method, which comprises: acquiring signals of an original image; acquiring a preset grayscale value of a white subpixel in each pixel of a converted image according to grayscale values of monochromatic subpixels in each pixel of an original image, in which the converted image is obtained by converting the original image from an RGB gamut to an RGBW gamut; and acquiring a target grayscale value of the white subpixel at least according to a minimum value of a first maximum grayscale of the white subpixel and the preset grayscale value, and allowing the target grayscale value of the white subpixel to be less than or equal to a minimum value of the first maximum grayscale and the preset grayscale value. As for a first saturation color patch in the original image, a first maximum grayscale of a white subpixel corresponding to each pixel disposed in the first saturation color patch is equal to a grayscale threshold, and the grayscale threshold is less than a maximum grayscale value allowed by a display device.

According to one aspect of embodiments of the present disclosure, there is provided a color gamut conversion method, comprising: acquiring RGB signals; calculating a preset grayscale value of a white subpixel of each pixel in an RGBW gamut when converting grayscale values of monochromatic subpixels in each pixel in an RGB gamut into the RGBW gamut according to grayscale values of monochromatic subpixels in each pixel of an original image corresponding to the RGB signals; obtaining at least one detection area from the original image through dividing, and determining whether the detection area is a high saturation color patch according to the brightness and saturations of pixels in the detection area; if it is determined that the detection area is a high saturation color patch, setting a first maximum grayscale of the white subpixel of the each pixel in the RGBW gamut in the high saturation color patch to be less than 255; and taking a minimum value of at least the first maximum grayscale and the preset grayscale value as a target grayscale value of the white subpixel.

Optionally, the obtaining the at least one detection area from the original image through dividing and determining whether the detection area is the high saturation color patch according to the brightness and saturations of the pixels in the detection area includes: setting a preset saturation range, a preset brightness threshold and a first preset proportion parameter; acquiring a proportion of pixels in the detection area, of which saturations are within the preset saturation range and brightness of which is greater than or equal to the preset brightness threshold, in all pixels of the original image; and determining that the detection area is the high saturation color patch when the proportion is greater than or equal to the first preset proportion parameter.

Optionally, after acquiring the first maximum grayscale and the preset grayscale value of the white subpixel, the method further comprises: setting a preset saturation threshold and a second preset proportion parameter; acquiring a proportion K of pixels in the original image, of which saturations are greater than the preset saturation threshold, in all the pixels of the original image; and taking K×255 as a second maximum grayscale of the white subpixel in the each pixel in the RGBW gamut when the proportion K is greater than the second preset proportion parameter. The taking the minimum value of at least the first maximum grayscale and the preset grayscale value as the target grayscale value of the white subpixel includes: taking the minimum value of the first maximum grayscale, the preset grayscale value and the second maximum grayscale as the target grayscale value of the white subpixel.

Optionally, before acquiring the proportion K of the pixels in the original image, of which the saturations are greater than the preset saturation threshold, in all the pixels of the original image, the method further comprises: acquiring a saturation of the each pixel of the original image, and normalizing the saturation.

Optionally, after acquiring the target grayscale value of the white subpixel, the method further comprises: splicing, in the RGBW gamut, the target grayscale value of the white subpixel and grayscale values of monochromatic subpixels, which are in a pixel same as the white subpixel, according to the distribution of subpixels in an RGBW image to be displayed, and generating RGBW signals.

Optionally, before generating the RGBW signals, the method further comprises: converting a saturation of any pixel into a value of the saturation to α-order power, in which $0<\alpha<1$; and acquiring grayscale values of monochromatic subpixels in the each pixel in the RGBW gamut according to the converted saturation of the pixel.

Optionally, after generating the RGBW signals, the method further comprises: adjusting chromaticity coordinates of an image to be displayed according to chromaticity coordinates of a reference white pixel, so as to allow chromaticity coordinates of white pixels in the image to be displayed to be overlapped with the chromaticity coordinates of the reference white pixel.

Optionally, the calculating the preset grayscale value of the white subpixel of the each pixel in the RGBW gamut when converting the grayscale values of the monochromatic subpixels in the each pixel in the RGB gamut into the RGBW gamut according to the grayscale values of the monochromatic subpixels in the each pixel of the original image corresponding to the RGB signals includes: a grayscale value of red subpixel Ri, a grayscale value of green subpixel Gi, and a grayscale value of blue subpixel Bi of the each pixel in the RGB gamut, and a grayscale value of red subpixel R1i, a grayscale value of green subpixel G1i, and a grayscale value of blue subpixel B1i of the each pixel in the RGBW gamut satisfy following formulas: Ri=R1i; Gi=G1i; Bi=B1i; and the grayscale value of red subpixel R1i, the grayscale value of green subpixel G1i, and the grayscale value of blue subpixel B1i of the each pixel in the RGBW gamut, and the preset grayscale value W1i of the white subpixel satisfy a following formula:

$$W_{1i} = \frac{1}{3}(R_{1i} + G_{1i} + B_{1i}) \times \frac{\text{MIN}(R_{1i}, G_{1i}, B_{1i})}{\text{MAX}(R_{1i}, G_{1i}, B_{1i})}.$$

Optionally, after obtaining the at least one detection area from the original image through dividing and determining whether the detection area is the high saturation color patch according to the brightness and saturations of the pixels in the detection area, the method further comprises: if it is determined that the detection area is not the high saturation color patch, setting the first maximum grayscale of the white subpixel in the each pixel, which is disposed in the detection area, in the RGBW gamut to be equal to 255.

According to another aspect of embodiments of the present disclosure, there is provided a computer device, comprising: a memory and a processor, in which computer programs that is able to be run on the processor are stored in the memory; and when the processor executes the computer programs, any foregoing method is implemented.

According to another aspect of embodiments of the present disclosure, there is provided a computer readable medium, in which when computer programs are executed by a processor, any foregoing method is implemented.

According to another aspect of embodiments of the present disclosure, there is provided a color gamut converter, comprising: a signal receiver configured to acquire RGB signals; a grayscale value generator electrically connected with the signal receiver and configured to calculate a preset grayscale value of a white subpixel of each pixel in an RGBW gamut when converting grayscale values of monochromatic subpixels in each pixel in an RGB gamut into the RGBW gamut according to grayscale values of monochromatic subpixels in each pixel of an original image corresponding to the RGB signals; a color patch detector electrically connected with the grayscale value generator and configured to obtain at least one detection area in the original image through dividing and determine whether the detection area is a high saturation color patch according to brightness and saturations of pixels in the detection area; a grayscale upper limit determiner electrically connected with the color patch detector and configured to set a first maximum grayscale of the white subpixel of the each pixel in the RGBW gamut in the high saturation color patch to be less than 255 when the color patch detector determines that the detection area is the high saturation color patch, or configured to set a first maximum grayscale of the white subpixel of the each pixel in the RGBW gamut in the detection area to be equal to 255 when the color patch detector determines that the detection area is not the high saturation color patch; and a target grayscale determiner electrically connected with the grayscale upper limit determiner and the grayscale value generator and configured to take a minimum value of at least the first maximum grayscale and the preset grayscale value as a target grayscale value of the white subpixel.

Optionally, the color gamut converter further comprises a saturation statistical device electrically connected with the signal receiver and configured to acquire a proportion K of subpixels in the original image, of which saturations are greater than a preset saturation threshold, in all pixels of the original image, and take K×255 as a second maximum grayscale of the white subpixel in each pixel in each RGBW gamut when the proportion K is greater than a second preset proportion parameter. The grayscale upper limit determiner is also connected with the saturation statistical device and configured to take a minimum value of the first maximum grayscale and the second maximum grayscale as a grayscale upper limit of the white subpixel. The target grayscale determiner is also connected with the grayscale upper limit determiner and configured to take a minimum value of the grayscale upper limit of the white subpixel and the preset grayscale value as the target grayscale value of the white subpixel.

Optionally, the color gamut converter further comprises: a signal generator electrically connected with the target grayscale determiner and configured to splice, in the RGBW gamut, the target grayscale value of the white subpixel and grayscale values of monochromatic subpixels in a pixel same as the white subpixel according to a distribution of subpixels in an RGBW image to be displayed, and generate RGBW signals.

Optionally, the color gamut converter further comprises a saturation adjuster and a first color space converter. The saturation adjuster is electrically connected with the signal receiver and configured to adjust a saturation of any pixel to be a value of the saturation to α-order power of the saturation, in which 0<α<1. The first color space converter is electrically connected with the saturation adjuster and configured to acquire grayscale values of monochromatic subpixels in the each pixel in the RGBW gamut according to the converted saturation of each pixel outputted by the saturation adjuster.

Optionally, the color gamut converter further comprises a chromaticity coordinate adjuster which is electrically connected with the signal generator and configured to adjust chromaticity coordinates of an image to be displayed according to chromaticity coordinates of a reference white pixel, so as to allow chromaticity coordinates of white pixels in the image to be displayed to be overlapped with the chromaticity coordinates of the reference white pixel.

According to another aspect of embodiments of the present disclosure, there is provided a display device, comprising: any foregoing color gamut converter.

As can be obtained through the above descriptions, in the color gamut conversion method provided by an embodiment of the present disclosure, the grayscale values of the monochromatic subpixels in each pixel in the RGB gamut can be converted into the RGBW gamut, and in the conversion process, the preset grayscale value of the white subpixel in each pixel in the RGBW gamut is acquired. On this basis, the method further comprises: determining whether there is a high saturation color patch with high saturation in the original image corresponding to the RGB gamut. If there is the high saturation color patch, the first maximum grayscale of the white subpixel in the pixel of the high saturation color patch is appropriately decreased, and the upper limit of the grayscale value of the white subpixel is limited. On this basis, the minimum value of the first maximum grayscale of the white subpixel and the preset grayscale value of the white subpixel acquired in the above step is taken as the target grayscale value of the white subpixel. In this way, even the RGB signal is converted into the RGBW signal, the saturation of the monochromatic subpixels, in the same pixel as the W subpixel, in the RGBW gamut still maintains the original saturation in the RGB gamut by reducing the grayscale value of the white subpixel in the high saturation color patch, so that the display effect of the image to be displayed can be improved after color gamut conversion.

BRIEF DESCRIPTION OF THE DRAWINGS

In order to clearly illustrate the technical solution of the embodiments of the disclosure, the drawings used in the description of the embodiments or relevant technologies will be briefly described in the following; it is obvious that the described drawings are only related to some embodiments of the disclosure and thus are not limitative of the disclosure.

DETAILED DESCRIPTION

Figure 1:
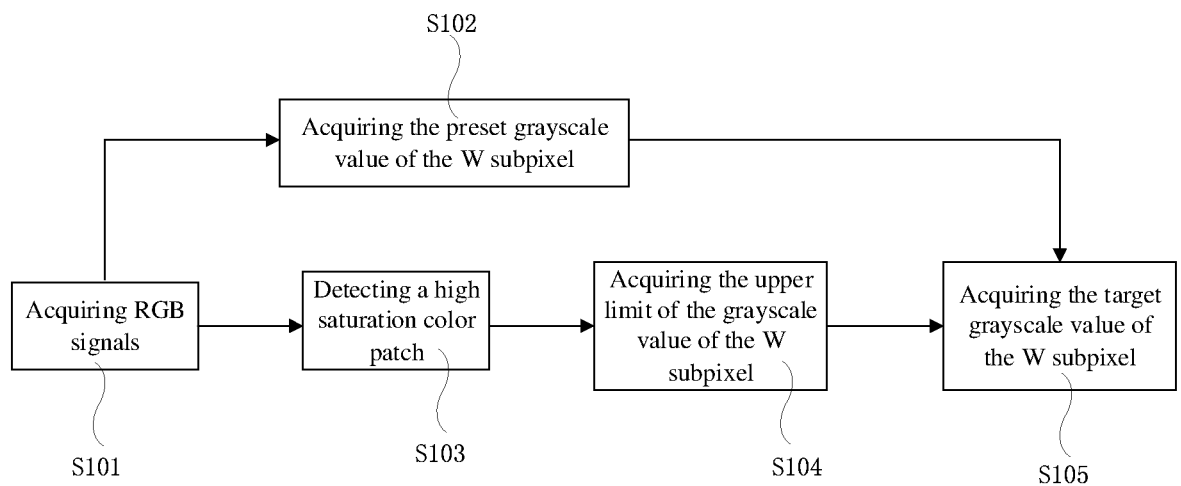
FIG. 1 is a flowchart of a color gamut conversion method provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The inventors of the present disclosure have noticed in research that in a four-primary-color (RGBW) display device, due to the addition of a W subpixel, the saturation of an output color of R, G, and B subpixels can be decreased. As a result, the color saturation of an image displayed by the four-primary-color display device can be reduced. In addition, the inventors of the present disclosure have also noticed in research that the addition of a W subpixel can also cause color cast problem.

At least one embodiment of the present disclosure provides a color gamut conversion method, which comprises: acquiring RGB signals; acquiring a preset grayscale value of a white subpixel in each pixel of a converted image according to grayscale values of monochromatic subpixels in each pixel of an original image corresponding to the RGB signals, in which the converted image is obtained by converting the original image from an RGB gamut to an RGBW gamut; and acquiring a target grayscale value of the white subpixel at least according to a first maximum grayscale of the white subpixels and the preset grayscale value, and allowing the target grayscale value of the white subpixel to be less than or equal to a minimum value of the first maximum grayscale of the white subpixel and the preset grayscale value, in which, as for a first saturation color patch in the original image, a first maximum grayscale of a white subpixel corresponding to each pixel disposed in the first saturation color patch is equal to a grayscale threshold, and the grayscale threshold is less than a maximum grayscale value allowed by a display device.

It should be noted that in some embodiments of the present disclosure, a first saturation color patch is an image area in the original image that satisfies a predetermined condition, and is also referred to as a high saturation color patch. In some examples, whether a detection area is a high saturation color patch may be determined according to the brightness and saturations of pixels in the detection area (the image area). In some other examples, whether a detection area is a high saturation color patch may also be determined according to the brightness, saturations and hues of the pixels in the detection area (the image area).

It should be noted that in some embodiments of the present disclosure, the color gamut conversion method refers to a color conversion method, namely a conversion method of color coding mode. For example, in some embodiments of the present disclosure, image signals adopting RGB color coding mode may be converted into image signals adopting RGBW color coding mode.

In some examples, the RGB color coding mode refers to a color coding mode that obtains various colors by superimposing three colors, which are red (R), green (G), and blue (B), and the RGBW color coding mode refers to a color coding mode that obtains various colors by superimposing four colors, which are R, G, B and W.

It should be noted that for clarity, the following description only employs the color gamut conversion method, but it can be understood by those skilled in the art that the color gamut conversion method described below may also be referred to as an image signal conversion method or an image subpixel rendering method.

It should be noted that the pixels in the RGBW gamut refer to pixels of an image adopting the RGBW color coding mode, and the pixels in the RGB gamut refer to pixels of an image adopting the RGB color coding mode.

In some examples, the step of acquiring a target grayscale value of a white subpixel at least according to a first maximum grayscale and a preset grayscale value of the white subpixel, and allowing the target grayscale value of the white subpixel to be less than or equal to the minimum value of the first maximum grayscale and the preset grayscale value of the white subpixel includes: taking the minimum value of the preset grayscale value and an upper limit of the grayscale value of the white subpixel as the target grayscale value of the white subpixel. For example, the upper limit of the grayscale value of the subpixel may be equal to the first maximum grayscale or equal to the minimum value of the first maximum grayscale and a second maximum grayscale.

In some examples, the step of acquiring a target grayscale value of the white subpixel at least according to a first maximum grayscale and a preset grayscale value of a white subpixel, and allowing the target grayscale value of the white subpixel to be less than or equal to the minimum value of the first maximum grayscale and the preset grayscale value of the white subpixel, includes: taking the minimum value of the first maximum grayscale, the preset grayscale value and a second maximum grayscale as the target grayscale value of the white subpixel. In some other examples, the step of acquiring a target grayscale value of a white subpixel at least according to a first maximum grayscale and a preset grayscale value of the white subpixel, and allowing the target grayscale value of the white subpixel to be less than or equal to the minimum value of the first maximum grayscale and the preset grayscale value of the white subpixel, includes: taking the minimum value of the first maximum grayscale and the preset grayscale value as the target grayscale value of the white subpixel.

For example, the maximum grayscale value allowed by the display device is equal to 255, and the grayscale threshold is selected from 90-110.

The color gamut conversion method provided by different embodiments and examples of the present disclosure will be described in a non-limiting manner with reference to the accompanying drawings. As described in the following, in case of no conflict, different features in these specific embodiments and examples can be combined so as to obtain new embodiments and examples, and the new embodiments and examples are also fall within the scope of present disclosure.

An embodiment of the present disclosure provides a color gamut conversion method. As illustrated in FIG. 1, the method comprises the following steps S101 to S105.

S101: acquiring RGB signals.

S102: acquiring the preset grayscale value of a W subpixel W1i.

For example, the RGB signal may be an image signal applied to a three-primary-color display device, and the image signal adopts RGB color coding mode.

Illustratively, the step S102 may include: calculating the preset grayscale value W1i of the white subpixel of each pixel in an RGBW gamut in the process of converting the grayscale values of monochromatic subpixels in each pixel in an RGB gamut into the RGBW gamut according to the grayscale values of monochromatic subpixels in each pixel of an original image corresponding to the RGB signals, that is, acquiring the preset grayscale value of the white subpixel in each pixel of a converted image according to the grayscale value of each pixel of the original image adopting the RGB color coding mode. Here, the converted image is obtained by converting the RGB gamut of the original image into the RGBW gamut (namely converting the coding mode of the image signal from the RGB color coding mode to the RGBW color coding mode).

Figure 2:
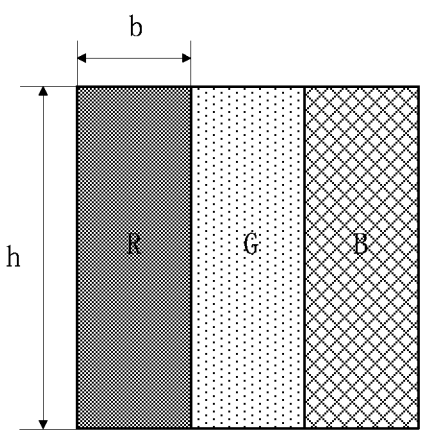
FIG. 2 is a schematic diagram illustrating a pixel in an RGB gamut in an embodiment of the present disclosure.

It should be noted that an embodiment of the present disclosure does not limit the subpixels used to form a pixel of the original image corresponding to the RGB signals. Optionally, in some embodiments, as illustrated in FIG. 2, a pixel 10 includes an R subpixel, a G subpixel and a B subpixel. Alternatively, the pixel 10 may also include a magenta subpixel, a cyan subpixel and a yellow subpixel. For convenient description, the following embodiments take the case that the pixel 10 includes the R subpixel, the G subpixel and the B subpixel as an example. For example, the height (h)-to-width (b) ratio of each subpixel may be 3:1.

Figure 3:
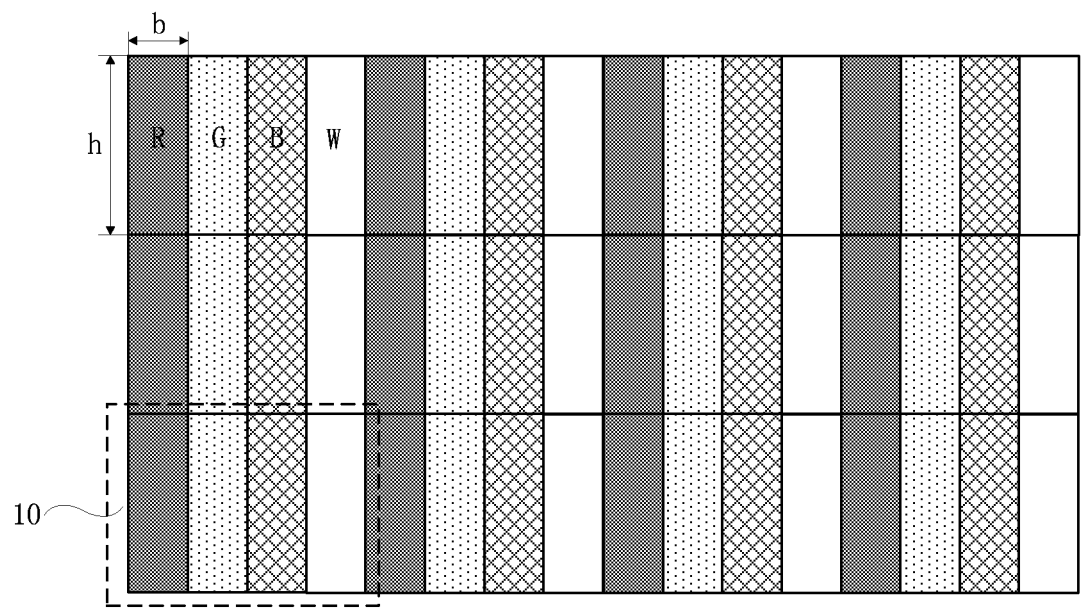
FIG. 3 is a schematic structural view illustrating an arrangement of pixels in an RGBW gamut in an embodiment of the present disclosure.

On this basis, after the grayscale values of the monochromatic subpixels in each pixel 10 in the RGB gamut are converted into the RGBW gamut, in order to keep the h/b ratio of the subpixel to still be 3:1 and keep the area unchanged, as illustrated in FIG. 3, in the process of forming a pixel arrangement structure corresponding to the RGBW gamut, partial subpixels in a pixel arrangement structure corresponding to the original RGB gamut may be replaced by W subpixels in the RGBW gamut. In this case, compared with the pixel arrangement structure corresponding to the RGB gamut, in the pixel arrangement structure corresponding to the RGBW gamut, the number of R, G and B subpixels is reduced by ¼.

S103: detecting a high saturation color patch (first saturation color patch).

Figure 4:
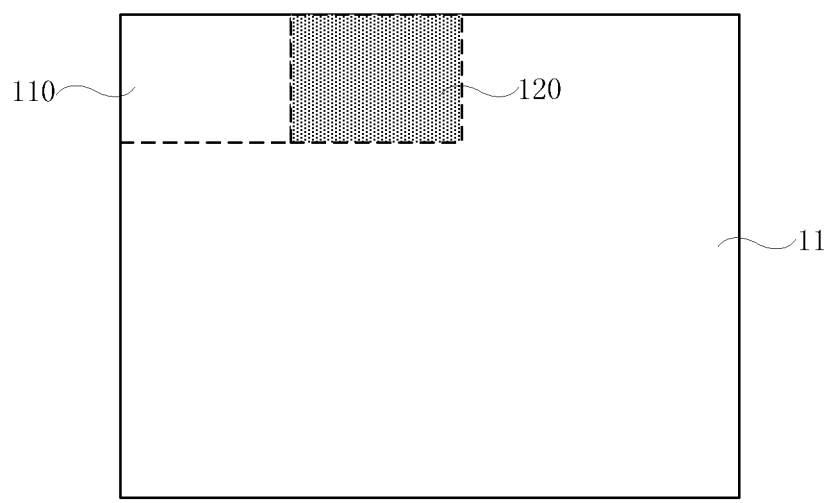
FIG. 4 is a schematic diagram illustrating the process of obtaining a detection area from an original image through dividing in the step S103 as illustrated in FIG. 1.

Illustratively, as illustrated in FIG. 4, the step S103 may include: dividing an original image 11 into at least one detection area 110, and determining whether the detection area 110 is a high saturation color patch (first saturation color patch) 120 according to the brightness or value (V) and saturations (S) of the pixels 10 in the detection area 110.

Optionally, the resolution of the original image 11 is N×M, N≥2, M≥2, and N and M are positive integers. In this case, the resolution of the detection area 110 divided from the original image 11 may be j×k, 1≤j≤N, 1≤k≤M, and j and k are positive integers. In which, N and M may be equal and may also be unequal, and k and j may be equal and may also be unequal. No limitation will be given in an embodiment of the present disclosure in this respect.

For example, the original image 11 may be divided into a plurality of detection areas 110, so the conversion effect of image signals can be improved.

Figure 5:
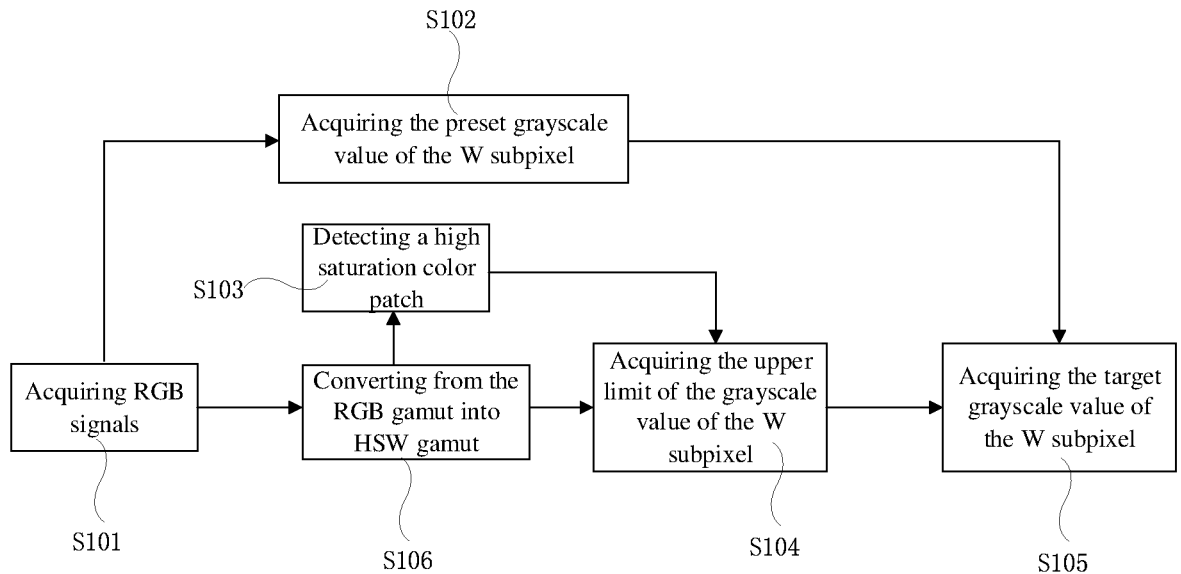
FIG. 5 is a flowchart of another color gamut conversion method provided by an embodiment of the present disclosure.

In some embodiments, in order to acquire the brightness (V), saturations (S) and hues (H) of the pixels 10, before executing the above step S103, the method further comprises the step S106 as illustrated in FIG. 5: converting the RGB gamut into HSW gamut.

Illustratively, the step S106 may include: respectively acquiring the hues (H), saturations (S) and brightness (V) of the pixels 10 by utilization of the following formula (1).

$$H = \begin{cases} 0° & \text{if max} = \text{min} \\ 60° \times \frac{G_i - B_i}{\text{max} - \text{min}} + 0°, & \text{if max} = R_i \text{ and } G_i \geq B_i \\ 60° \times \frac{G_i - B_i}{\text{max} - \text{min}} + 360°, & \text{if max} = R_i \text{ and } G_i < B_i \\ 60° \times \frac{B_i - R_i}{\text{max} - \text{min}} + 120°, & \text{if max} = G_i \\ 60° \times \frac{R_i - B_i}{\text{max} - \text{min}} + 240°, & \text{if max} = B_i \end{cases} \quad (1)$$

$$S = \begin{cases} 0, & \text{if max} = 0 \\ \frac{\text{max} - \text{min}}{\text{max}} = 1 - \frac{\text{min}}{\text{max}}, & \text{otherwise} \end{cases}$$

$$V = \text{max}$$

That is, the hues (H), saturations (S) and brightness (V) of the pixels 10 are obtained according to the grayscale values of the monochromatic subpixels, in each pixel 10 of the original image 11 corresponding to the RGB signals acquired in the step S101, in the RGB gamut, for example, the grayscale value of red subpixel Ri, the grayscale value of green subpixel Gi, and the grayscale value of blue subpixel Bi.

It should be noted that in the above formula (1), "max" refers to the maximum grayscale value in the red subpixel, the green subpixel and the blue subpixel of a pixel 10; and "min" refers to the minimum grayscale value in the red subpixel, the green subpixel and the blue subpixel of the pixel 10.

Figure 6:
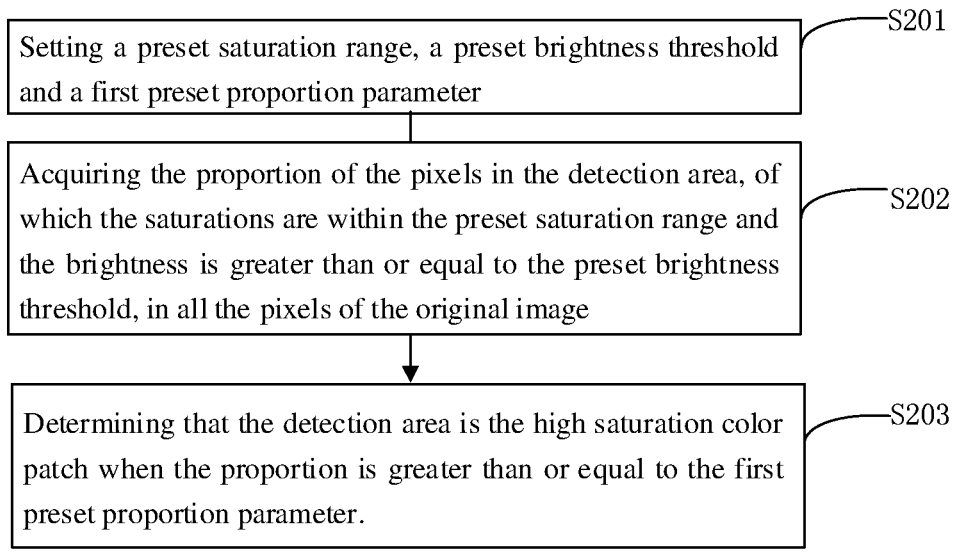
FIG. 6 is a flowchart illustrating the specific method of the step S103 as illustrated in FIG. 1 or FIG. 5.

For example, the high saturation color patch 120 is the detection area 110 with a large number of pixels 10 of certain color and the saturations and brightness of the pixels 10 of certain color is relatively large. When the pixels 10 satisfying the above conditions in the high saturation color patch 120 displays yellow, the above saturation color patch 120 can be referred to as a yellow color patch. Illustratively, the process of determining whether the detection area 110 is a high saturation color patch 120, as illustrated in FIG. 6, may include the following steps S201-S203.

S201: setting a preset saturation range (S_th1, S_th2), a preset brightness threshold V_th and a first preset proportion parameter a1.

It should be noted that in the case where the colors of the high saturation color patches 120 to be detected are different, the settings of the preset saturation range, the preset brightness threshold V_th and the first preset proportion parameter a1 are also different. For example, when the high saturation color patch 120 to be detected is a yellow color patch, optionally, the lower limit S_th1 in the preset saturation range satisfies S_th1=0.15, and the upper limit S_th2 in the preset saturation range satisfies S_th2=0.8; the preset brightness threshold V_th satisfies V_th=0.7; and the first preset proportion parameter a1 satisfies a1=0.6.

S202: acquiring the proportion of the pixels 10 in the detection area 110, of which the saturation S is within the preset saturation range (S_th1, S_th2) and the brightness H is greater than or equal to the preset brightness threshold V_th, in all the pixels 10 of the original image 11 (for example, the ratio of the number of the pixels 10 in the detection area 110, of which the saturation S is within the preset saturation range and the brightness H is greater than or equal to the preset brightness threshold V_th, to the number of all the pixels 10 in the original image 11).

Where the pixel 10 is yellow when the saturation S of the pixel 10 in the detection area 110 satisfies 0.15≤S≤0.8 and the brightness H satisfies H≥0.7.

S203: determining that the detection area 110 is the high saturation color patch 120, namely the yellow color patch, when the proportion acquired in the step S202 is greater than or equal to the first preset proportion parameter a1.

Description is given above to the detection of the high saturation color patch 120 by taking the case that the high saturation color patch 120 is a yellow color patch as an example. When the high saturation color patch 120 is of other colors, for example, is a color patch of red, blue, green, cyan, magenta or other colors, relevant values in the step S201, for example, the preset saturation range (S_th1, S_th2) and the preset brightness threshold V_th, can be adjusted so that the pixels 10 satisfying the preset saturation range (S_th1, S_th2) and the preset brightness threshold V_th display the color to be detected, and the proportion of the pixels 10 with this color satisfies the first preset proportion parameter a1. Other detection steps may refer to the color gamut conversion method and will not be further described here.

In some examples, whether the detection area 110 is a high saturation color patch (first saturation color patch) 120 may also be determined according to the brightness (V), saturations (S) and hues (H) of the pixels 10 in the detection area 110.

For example, the process of determining whether the detection area 110 is a high saturation color patch 120 may include the following steps S211-S213.

S211: setting a preset saturation threshold S_th, a preset hue range (H_th1, H_th2), a preset brightness threshold V_th and a first preset proportion parameter a1.

S212: acquiring the proportion of the pixels 10 in the detection area 110, of which the saturation S is greater than the preset saturation threshold S_th, the hue is within the preset hue range (H_th1, H_th2), and the brightness H is greater than or equal to the preset brightness threshold V_th, in all the pixels 10 of the original image 11.

S213: determining that the detection area is the high saturation color patch 120, namely the yellow color patch, when the proportion acquired in the step S212 is greater than or equal to the first preset proportion parameter a1.

For example, the color of the color patch to be detected can be selected by setting the preset hue range (H_th1, H_th2). For example, by adjusting the preset hue range (H_th1, H_th2), the step S103 may be used for detecting whether the original image includes at least one of a yellow high saturation color patch, a red high saturation color patch, a blue high saturation color patch, a green high saturation color patch, a cyan high saturation color patch, or a magenta high saturation color patch.

It should be noted that in an embodiment of the present disclosure, obtaining of information corresponding to the value, saturation, and hue of the pixel 10 is not limited to be realized through converting the original image from the RGB color space to the HSV color space. In some examples, an embodiment of the present disclosure may also convert the original image from the RGB color space to other color spaces (e.g., HSL color space), as long as the information corresponding to the value, saturation and hue of the pixel 10 can be acquired. For example, the HSL color space includes hue (H), saturation (S) and lightness (L) components. For example, both the HSL color space and the HSV color space are referred to as HSB color space, and the HSB color space includes hue (H), saturation (S) and brightness (B) components.

S104: acquiring the upper limit of the grayscale value of the W subpixel.

For example, the step S104 includes: when there is high saturation color patch in the original image, allowing the first maximum grayscale of the white subpixel corresponding to each pixel disposed in the high saturation color patch to be equal to a grayscale threshold, in which the grayscale threshold is less than the maximum grayscale value allowed by the display device; and allowing the first maximum grayscale of the white subpixel corresponding to each pixel of the pixels, which are disposed in the original image and at the outside of the high saturation color patch, to be equal to the maximum grayscale value allowed by the display device. For example, the maximum grayscale value allowed by the display device is equal to 255, and the grayscale threshold is selected from 90-110 (e.g., 100). It should be noted that the maximum grayscale value allowed by the display device is not limited to be equal to 255 and may also be 1023 and the like, and in this case, the grayscale threshold may be correspondingly modified. For example, the grayscale threshold is within ⅓-½ of the maximum grayscale value allowed by the display device.

In one example, the step S104 includes: after the step S103 is executed, if the detection area 110 is the high saturation color patch 120, setting the first maximum grayscale W_lim1 of the W subpixel in each pixel 10 in the RGBW gamut in the high saturation color patch 120 to be less than 255. Taking the case that the high saturation color patch 120 is a yellow color patch as an example, in some embodiments, the specific value of the first maximum grayscale W_lim1 of the W subpixel may be set according to color appearance theory, that is, on a bright background, such as a white background, the yellow color patch has no obvious color cast. Optionally, the first maximum grayscale W_lim1 of the W subpixel satisfies W_lim1=100.

In some embodiments, after the step S103 is executed, if the detection area 110 is the high saturation color patch 120, the first maximum grayscale W_lim1 of the W subpixel in each pixel 10 of the high saturation color patch 120 satisfies W_lim1=100.

In some other embodiments, the specific value of the first maximum grayscale W_lim1 of the W subpixel may be set according to the aperture ratio and the transmittance of the W subpixel. In which, after the above step S103 is executed, if the detection area 110 is the high saturation color patch 120, the first maximum grayscale of the W subpixel in each pixel 10 of the high saturation color patch 120 is in inverse proportion to the aperture ratio or the transmittance of the W subpixel.

As known from above, after the step S103 is executed, if the detection area 110 is the high saturation color patch 120, the upper limit of the grayscale value of the W subpixel in the high saturation color patch 120 can be limited at least through the step S104, so as to avoid the reduction of the saturation of the high saturation color patch 120 or the color cast of the high saturation color patch 120 due to too large brightness of the W subpixel, such that the reduction of the display effect of the image to be displayed corresponding to the RGBW gamut can be avoided.

After the step S103 is executed, if the detection area 110 is not the high saturation color patch 120, the first maximum grayscale W_lim1 of the W subpixel in each pixel 10 in the RGBW gamut in the detection area 110 is set to be 255 (for example, the maximum grayscale value allowed by the display device).

In some examples of an embodiment of the present disclosure, the first maximum grayscale W_lim1 of the W subpixel in each pixel 10 may be taken as the upper limit W_L of the grayscale value of the W subpixel.

S105: acquiring the target grayscale value of the W subpixel.

The step S105 includes: at least taking the minimum value of the first maximum grayscale W_lim1 of the W subpixel and the preset grayscale value of the W subpixel which is acquired in the above step S102 as the target grayscale value Wt of the W subpixel, namely Wt=min(W_lim1, W1i).

For example, in the color gamut conversion method provided by an embodiment of the present disclosure, the grayscale value of the monochromatic subpixels in each pixel in the RGB gamut may be converted into the RGBW gamut, and in the above conversion process, the grayscale threshold W1i of the W subpixel in each pixel in the RGBW gamut is acquired. On this basis, the method further comprises the process of determining whether there is a high saturation color patch 120 with high saturation in the original image 11 corresponding to the RGB gamut. If there is the high saturation color patch 120, the first maximum grayscale W_lim1 of the W subpixel in the pixel 10 of the high saturation color patch 120 is appropriately reduced, and the upper limit of the grayscale value of the W subpixel is limited. On this basis, the minimum value of the first maximum grayscale W_lim1 of the W subpixel and the preset grayscale value of the W subpixel acquired in the above step S102 is taken as the target grayscale value Wt of the W subpixel. For example, the method can reduce the color cast problem of the converted image caused by the process of converting the color coding mode of image signals, and can correspondingly alleviate the problem of reduced saturation of the converted image. For example, even the RGB signal is converted into the RGBW signal, the saturation of the monochromatic subpixels, which are disposed in the same pixel 10 as the W subpixel, in the RGBW gamut still maintains the original saturation in the RGB gamut by reducing the grayscale value of the W subpixel in the high saturation color patch 120. Thus, the display effect of the image to be displayed can be improved after color gamut conversion.

As known from above, in the RGBW gamut, when the saturation of a monochromatic subpixel in a pixel 10 is high, the grayscale value of the W subpixel in the pixel 10 can be appropriately reduced.

For example, the preset grayscale value W1i of the W subpixel acquired in the above step S102 can satisfy the following formula:

$$W_{1i} = \frac{1}{3}(R_{1i} + G_{1i} + B_{1i}) \times \frac{\text{MIN}(R_{1i}, G_{1i}, B_{1i})}{\text{MAX}(R_{1i}, G_{1i}, B_{1i})} \qquad (2)$$

Here, in the formula (2), the grayscale value of the R subpixel in each pixel 10 in the RGBW gamut is R1i; the grayscale value of the G subpixel is G1i; the grayscale value of the B subpixel is B1i; and the preset grayscale value of the W subpixel is W1i.

MIN(R1i, G1i, B1i) indicates the grayscale value corresponding to the subpixel with the minimum grayscale value of each pixel 10 in the RGBW gamut. MAX(R1i, G1i, B1i) indicates the grayscale value corresponding to the subpixel with the maximum grayscale value of each pixel 10 in the RGBW gamut.

In addition, the grayscale value of the R subpixel Ri, the grayscale value of the G subpixel Gi, and the grayscale value of the B subpixel Bi in each pixel 10 in the RGB gamut, and the grayscale value of the R subpixel R1i, the grayscale value of the G subpixel G1i, and the grayscale value of the B subpixel B1i in each pixel 10 in the RGBW gamut satisfy the following formula:

$$Ri=R1i;\ Gi=G1i;\ Bi=B1i \qquad (3)$$

As known from the above formula (3), in the process of converting the RGB gamut into the RGBW gamut, the grayscale values of the monochromatic subpixels (R, G, B) in the pixel 10 do not change.

In addition, when the preset grayscale value of the W subpixel calculated by the formula (2) is W1i, the fraction (e.g., expression) MIN(R1i, G1i, B1i)/MAX(R1i, G1i, B1i) can be set in the formula (2), so as to avoid the distortion of the calculated preset grayscale value W1i of the W subpixel in the RGBW gamut when the grayscale values of the subpixels in each pixel 10 in the RGB gamut are converted into the RGBW gamut.

Illustratively, for example, in the original image corresponding to the RGB signal acquired by the above step S101, the grayscale value of the R subpixel Ri, the grayscale value of the G subpixel Gi, and the grayscale value of the B subpixel Bi in a pixel 10 of corresponding RGB gamut are respectively: Ri=240, Gi=2, Bi=1. In this case, as known from the formula (1), the saturation S of the pixel 10 provided with the above three monochromatic subpixels is close to 1, so the saturation S is high.

In this case, the grayscale value of the W subpixel in the pixel 10 can be set to be very small, e.g., equal to or close to 0. In this way, the saturation of the pixel 10 can be kept unchanged, and the color of the pixel 10 cannot be diluted by the W subpixel. For example, the color saturation of the pixel 10 cannot be obviously reduced due to the additionally added W subpixel.

For example, if there is no fraction MIN(R1i, G1i, B1i)/MAX(R1i, G1i, B1i) in the above formula (2), the calculated preset grayscale value W1i of the W subpixel is 81. In this case, the grayscale value of the W subpixel is relatively large, so the color of the pixel 10 provided with the W subpixel can be diluted, and then the saturation of the pixel 10 can be affected. After the fraction MIN(R1i, G1i, B1i)/MAX(R1i, G1i, B1i) is set in the above formula (2), the calculated preset grayscale value W1i of the W subpixel is 0.3, approximately equal to 0. In this case, the grayscale value of the W subpixel is very small, so as to ensure that the saturation of the pixel 10 provided with the W subpixel be unchanged.

In addition, when the acquired grayscale values of the monochromatic subpixels in the original image corresponding to the RGB signals acquired in the step S101 are all equal, for example, R=G=B=81. In this case, the ratio of the above monochromatic subpixels is R:G:B=1:1:1, and the pixel 10 emits white light. In this case, the brightness of the W subpixel in the pixel 10 can be increased, and then the overall brightness of the display image is improved. In this case, even the above fraction MIN(R1i, G1i, B1i)/MAX(R1i, G1i, B1i) is set in the formula, the preset grayscale value W1i of the W subpixel acquired by the above formula (2) can still be 81.

Therefore, more appropriate preset grayscale value W1i of the W subpixel can be acquired by utilization of the above formula (2) according to user demands.

It should be noted that an embodiment of the present disclosure is not limited to calculate the preset grayscale value W1i of the W subpixel according to the grayscale value of the R subpixel R1i, the grayscale value of the G subpixel G1i, and the grayscale value of the B subpixel B1i in each pixel 10 in the RGBW gamut, and may also calculate the preset grayscale value W1i of the W subpixel according to the grayscale value of the R subpixel Ri, the grayscale value of the G subpixel Gi, and the grayscale value of the B subpixel Bi in each pixel 10 in the RGB gamut.

For example, in some examples (for example, when the examples do not include the step of adjusting the saturation of the original image), the grayscale value of the R subpixel R1i, the grayscale value of the G subpixel G1i, and the grayscale value of the B subpixel B1i in each pixel 10 in the RGBW gamut may be taken as the target grayscale value of the R subpixel, the target grayscale value of the G subpixel, and the target grayscale value of the B subpixel in each pixel 10 in the RGBW gamut and be used for forming the RGBW signals.

An embodiment of the present disclosure is not limited to take the first maximum grayscale as the upper limit of the grayscale value of the subpixel. In some examples, the minimum value of the first maximum grayscale and a second maximum grayscale may be taken as the upper limit of the grayscale value of the subpixel. Exemplary description will be given below with reference to the steps S107 and S301-S303.

Figure 7:
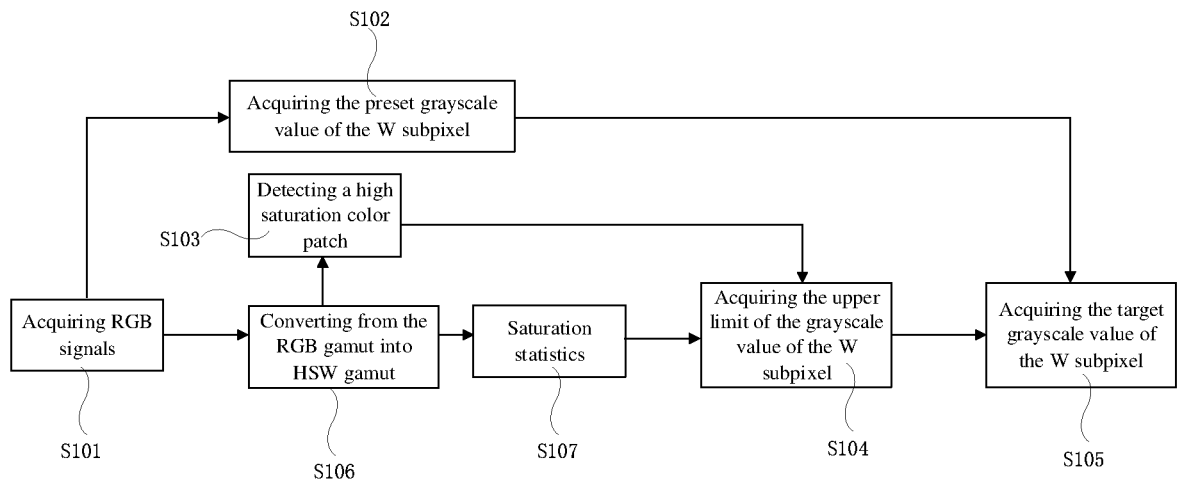
FIG. 7 is a flowchart of another color gamut conversion method provided by an embodiment of the present disclosure.

For example, in order to further improve the display effect of the converted image, optionally, after acquiring the first maximum grayscale W_lim1 and the preset grayscale value W1i of the W subpixel, as illustrated in FIG. 7, the method further comprises the following step S107.

S107: acquiring the number of pixels 10 with high saturation in the original image 11 by saturation statistics, and further adjusting the upper limit of the grayscale value of the W subpixel according to the statistical result.

It should be noted that the step S107 is not limited to be executed after acquiring the first maximum grayscale W_lim1 and the preset grayscale value W1i of the W subpixel, and may also be executed before or simultaneously executed in the process of acquiring the first maximum grayscale W_lim1 and the preset grayscale value W1i of the W subpixel.

Figure 8:
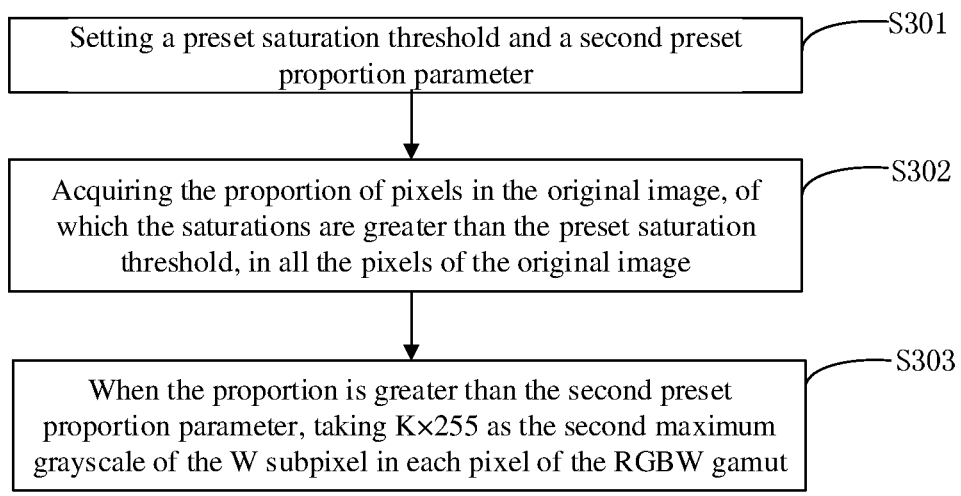
FIG. 8 is a flowchart illustrating the specific method of the step S107 as illustrated in FIG. 7.

Illustratively, as illustrated in FIG. 8, the step S107 may include the following steps S301-S303.

S301: setting a preset saturation threshold S_th and a second preset proportion parameter a2.

S302: acquiring the proportion K of pixels 10 in the original image 11, of which the saturations S are greater than the preset saturation threshold S_th, in all the pixels 10 of the original image 11 (for example, the number of the pixels 10, of which the saturations S are greater than the preset saturation threshold S_th in the original image 11, to the number of all the pixels 10 in the original image 11).

It should be noted that the preset saturation threshold S_th in the step S301 and the preset saturation threshold S_th in the step S211 may be equal to each other, or one of both may be omitted.

Optionally, for the convenience of saturation statistics, before the step S302, the method further comprises: acquiring the saturations S of the pixels 10 in the original image 11, and normalizing the saturations S.

Description has been given above to the statistical process of the normalized saturation in the step S302 by taking the preset saturation threshold S_th=0.8 as an example.

In some embodiments, the saturation of each pixel 10 may be determined one by one, and a counter, for example, is counted once when the saturation S of a pixel 10 satisfies S≥0.8. After the saturations of all the pixels 10 are determined, the above proportion K is obtained according to statistical values obtained by the counter.

Alternatively, in some other embodiments, the saturations of all the pixels 10 may be graded, for example, divided into five levels, 0-0.2, 0.2-0.4, 0.4-0.6, 0.6-0.8, 0.8-1.0. Then, because the preset saturation threshold S_th satisfies S_th=0.8, the number of the pixels 10 of which the saturation S is within the range 0.8-1.0 may be directly analyzed statistically to obtain the above proportion K.

S303: when the above proportion K is greater than the second preset proportion parameter a2, taking K×255 as the second maximum grayscale W_lim2 of the W subpixel in each pixel 10 in the RGBW gamut.

In one example, the above step S104 may include: calculating the minimum value of the first maximum grayscale W_lim1 and the second maximum grayscale W_lim2 at first so as to obtain the upper limit W_L of the grayscale value of the W subpixel, namely W_L=min(W_lim1, W_lim2). Then, the above step S105 includes: taking the minimum value of the upper limit W_L of the grayscale value of the W subpixel and the preset grayscale value W1i as the target grayscale value Wt of the W subpixel, namely Wt=min(W_L, W1i).

In another example, after acquiring the first maximum grayscale W_lim1, the second maximum grayscale W_lim2 and the preset grayscale value W1i, the above step S105 may include: taking the minimum value of the first maximum grayscale W_lim1, the preset grayscale value W1i and the second maximum grayscale W_lim2, namely min(W_lim1, W_lim2, W1i), as the target grayscale value Wt of the W subpixel.

For example, in the process of acquiring the target grayscale value Wt of the W subpixel, the analyze process of the pixels 10 with high saturation in the overall original image 11 statistically is added, and the statistical result will affect the target grayscale value Wt of the W subpixel, so as to reduce the influence of the W subpixel on the saturation of the overall image to be displayed (or the converted image) corresponding to the RGBW gamut.

Figure 9:
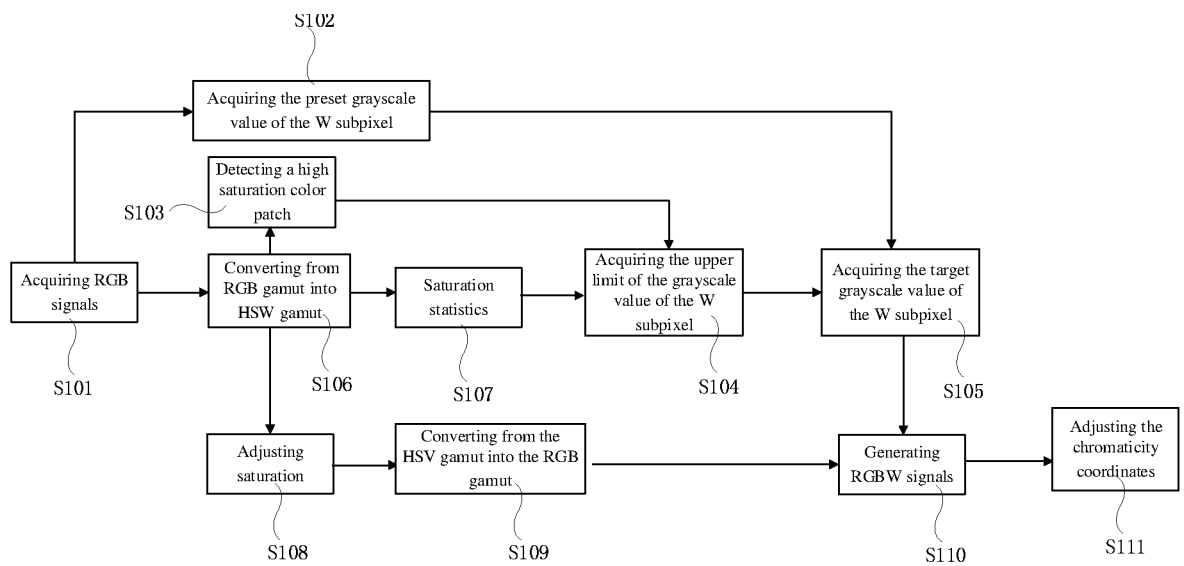
FIG. 9 is a flowchart of another color gamut conversion method provided by an embodiment of the present disclosure.

After normalizing the acquired saturations of the pixels 10 in the original image 11, as illustrated in FIG. 9, the above method further comprises the following step S108.

S108: adjusting saturation.

Optionally, the above step S108 includes: converting the saturation of any pixel 10 into the value of the saturation of the any pixel 10 to the α-order power, namely the converted saturation S' satisfies $S'=S^{\alpha}$, in which $0<\alpha<1$.

Because the saturation S before conversion is subjected to normalization, the value of the saturation S' after conversion is slightly greater than the value of the saturation S before conversion.

For example, when α is less than 0 or greater than 1, the difference between the value of S' after conversion according to the formula $S'=S^{\alpha}$ and the saturation S before conversion is relatively large, which is unfavorable for the fine tuning of the saturation and reduces the accuracy of fine tuning. Optionally, a can be equal to 0.2, 0.5, 0.7, or the like, and no limitation will be given in an embodiment of the present disclosure in this respect.

For example, the method further comprises the following step S109.

S109: converting the grayscale values from the HSV gamut into the RGB gamut.

The above step S109 specifically includes: after executing the above step S108, acquiring the grayscale values of the monochromatic subpixels (R, G, B) in each pixel 10 in the RGBW gamut according to the converted saturation S' of the pixel 10 by utilization of the inverse formula of the formula (1). For example, the grayscale values acquired by the above inverse formula may be taken as the target grayscale values of the monochromatic subpixels (RGB) in each pixel 10 in the RGBW gamut, and may be used for generating RGBW signals.

After acquiring the grayscale values of the monochromatic subpixels (RGB) in each pixel 10 in the RGBW gamut and the target grayscale value Wt of the W subpixel, the above method further comprises: executing the step S110: generating RGBW signals.

For example, the above step S110 may include: splicing, in the RGBW gamut, data corresponding to the target grayscale value Wt of the W subpixel and data corresponding to the grayscale values of the monochromatic subpixels (R, G, B), which are in the same pixel 10 as the W subpixel, according to the distribution of the subpixels in the RGBW image to be displayed (for example, the pixel arrangement structure corresponding to the RGBW gamut as illustrated in FIG. 3) and generating the RGBW signals.

For example, because different users are adapt to different color temperatures of display images (for example, the color temperatures to which users living in areas of different latitudes are accustomed are not necessarily the same), in order to meet the requirements of different users, after generating the RGBW signals, before displaying an image, as illustrated in FIG. 9, the method may also include the step S111: adjusting the chromaticity coordinate.

The step S111 includes: adjusting the chromaticity coordinate of an image to be displayed (for example, an image after the conversion of color coding mode) corresponding to the RGBW gamut after color gamut conversion according to chromaticity coordinates of reference white pixels, so that the chromaticity coordinate D of the white pixel in the image to be displayed can be overlapped with the chromaticity coordinate of the reference white pixel.

Figure 10:
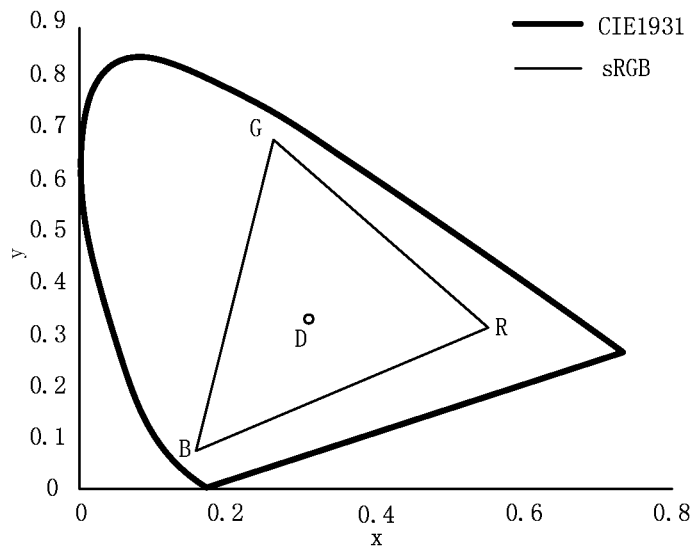
FIG. 10 is a color gamut diagram according to an embodiment of the present disclosure.

For example, the above chromaticity coordinate is as illustrated by the CIE1931 chromatic diagram in FIG. 10, and the color gamut sRGB is formed by a triangle connected by coordinate points where R, G, B three primary colors are located. The chromaticity coordinate D of a white spot in the chromaticity coordinate can determine the position of the color gamut sRGB within the range of the CIE1931 chromatic diagram, and then can determine the effect of the display image that the user ultimately views, such as color temperature.

The chromaticity coordinates of the reference white pixels may be set according to user demands. For example, the chromaticity coordinate of the reference white pixel may be chromaticity coordinate point D65 of white light in equal-energy spectrum, and may also be D50, D55 and the like, and no limitation will be given in an embodiment of the present disclosure in this respect, as long as the display effect of the image to be displayed, such as the color temperature, can satisfy user demands after the chromaticity coordinate D of the white pixel in the image to be displayed is overlapped with the chromaticity coordinate of the reference white pixel.

For example, the RGBW signals after chromaticity coordinate adjustment can be inputted into a display panel having the pixel arrangement structure as illustrated in FIG. 3, and such that a display image corresponding to the RGBW gamut can be displayed.

It should be noted that any color can be acquired by the proportional distribution of three primary colors such as R, G and B, so any color has a certain position in the CIE1931 chromatic diagram as illustrated in FIG. 10. In which, in the CIE1931 chromatic diagram, X axis represents the proportion factor of the R primary color in a color to be displayed, and Y axis represents the proportion factor of the G primary color. There is also Z axis perpendicular to the plane provided with the X axis and the Y axis, and this axis represents the proportion factor of the B primary color. Because the proportion factors of the primary colors are $X+Y+Z=1$, the proportion factor Z of the B primary color can also be deduced through this formula.

An embodiment of the present disclosure further provides a computer device, which comprises a memory and a processor. Computer program instructions applicable to be executed by the processor are stored on the memory. When the computer program instructions are run by the processor, the processor runs any foregoing color gamut conversion method. The computer device has the same technical effects with the color gamut conversion method provided by the foregoing embodiment, and no further description will be given here. For example, the computer device may be an image signal conversion device, an image signal coding mode conversion device or a color gamut conversion device.

An embodiment of the present disclosure provides a non-transitory storage medium. Computer program instructions are stored in the non-transitory storage medium. When the computer program instructions are run by a processor, a computer executes any foregoing color gamut conversion method. The computer readable medium has the same technical effects with the color gamut conversion method provided by the foregoing embodiment, and no further description will be given here.

Figure 11:
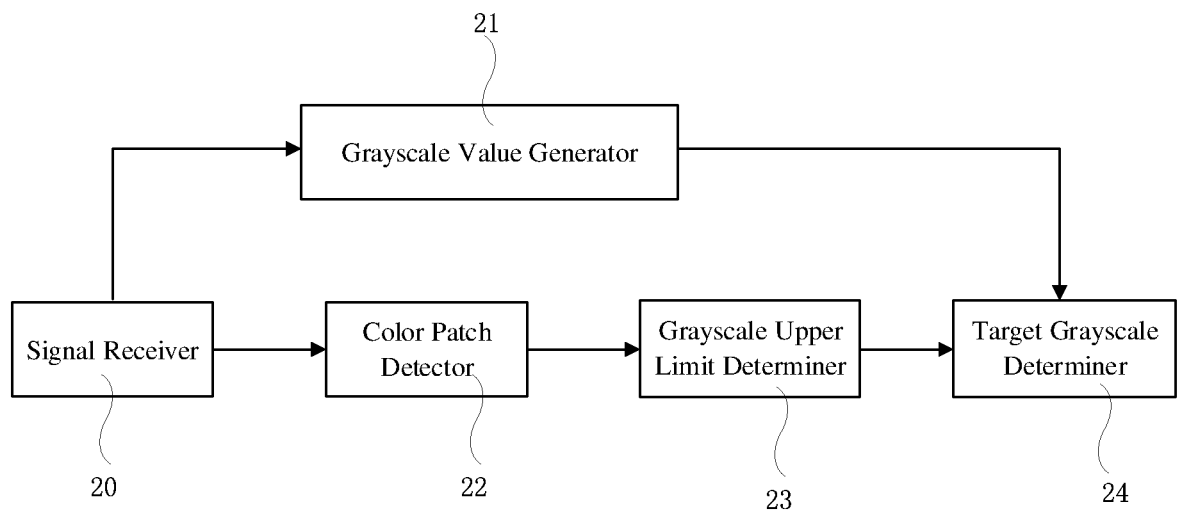
FIG. 11 is a schematic structural view of a color gamut converter provided by an embodiment of the present disclosure.

An embodiment of the present disclosure provides a color gamut converter, which, as illustrated in FIG. 11, comprises: a signal receiver 20, a grayscale value generator 21, a color patch detector 22, a grayscale upper limit determiner 23 and a target grayscale determiner 24.

In some examples, the color gamut converter may be not provided with the color patch detector 22. In this case, the information of high saturation color patches of an original image may be received from the outside of the color gamut converter. For example, the color gamut converter may also be referred to as an image signal converter or an image signal coding mode converter.

Illustratively, the signal receiver 20 is configured to acquire RGB signals.

The grayscale value generator 21 is electrically connected with the signal receiver 20 and configured to calculate the preset grayscale value W1i of a white subpixel in each pixel 10 in an RGBW gamut in the process of converting the grayscale values of monochromatic subpixels in each pixel 10 in an RGB gamut into the RGBW gamut according to the grayscale values of monochromatic subpixels in each pixel 10 of an original image 11 corresponding to the RGB signals acquired by the signal receiver 20, that is, the grayscale value generator 21 is configured to acquire the preset grayscale value of the white subpixel in each pixel of the converted image according to the grayscale value of each pixel of the original image adopting the RGB color coding mode. Here, the converted image is obtained by converting the original image from the RGB gamut to the RGBW gamut (namely converting the coding mode of image signals from RGB color coding mode to RGBW color coding mode).

For example, the acquisition process of the preset grayscale value W1i of the white subpixel in each pixel 10 in the RGBW gamut may refer to the color gamut conversion method, and will not be further described here.

The color patch detector 22 is electrically connected with the grayscale value generator 21. The color patch detector 22 is configured to divide the original image 11 into at least one detection area 110, and determine whether the detection area 110 is a high saturation color patch 120 according to the brightness and saturations of the pixels 10 in the detection area 110 (for example, the brightness, saturations and hues of the pixels 10 in the detection area 110). For example, the determination process of the high saturation color patch 120 may refer to the color gamut conversion method, and no further description will be given here.

Figure 12:
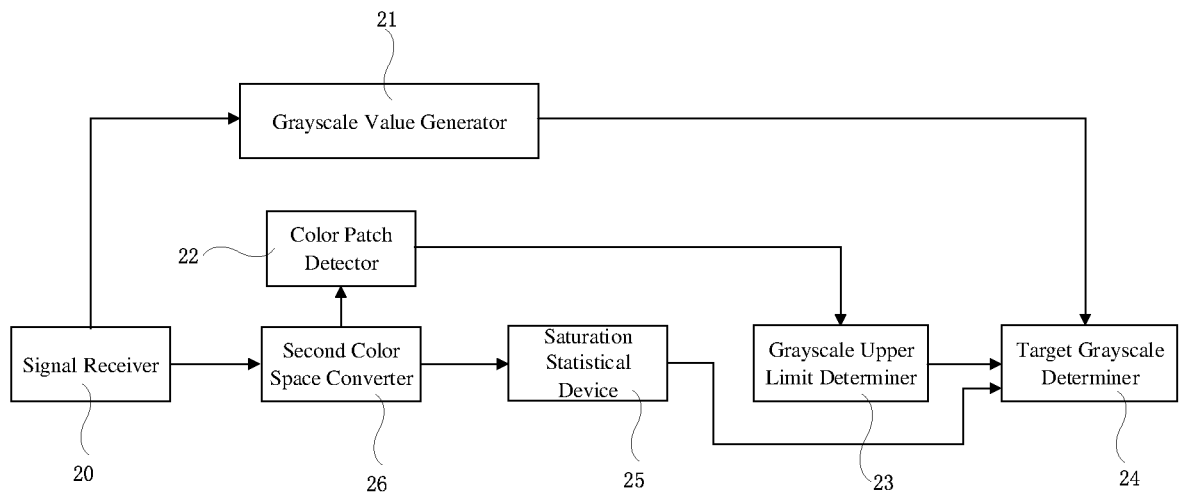
FIG. 12 is a schematic structural view of another color gamut converter provided by an embodiment of the present disclosure.

For example, at least the saturations of the pixels 10 in the original image 11 are known in the process of adopting the color patch detector 22 to detect the high saturation color patch 120. Thus, the color gamut converter, as illustrated in FIG. 12, also comprises a second color space converter 26. The second color space converter 26 is configured to acquire the hue (H), saturation (S) and brightness (V) of the pixel 10 by utilization of the above formula (1) according to the grayscale values of the monochromatic subpixels, in each pixel 10 of the original image 11 corresponding to the RGB signals acquired by the signal receiver 20, in the RGB gamut.

In this case, the color patch detector 22 is connected with the second color space converter 26, and then can receive hue (H), saturation (S) and brightness (V) data of each pixel 10 outputted by the second color space converter 26. The grayscale upper limit determiner 23 is electrically connected with the color patch detector 22 and configured to set the first maximum grayscale W_lim1 of the W subpixel in each pixel 10 in the RGBW gamut in the high saturation color patch 120 to be less than 255 or the maximum grayscale value allowed by the display device when the color patch detector 22 determines that the detection area 110 is the high saturation color patch 120. In this case, in some examples of an embodiment of the present disclosure, the first maximum grayscale W_lim1 of the W subpixel in each pixel 10 may be taken as the upper limit W_L of the grayscale value of the W subpixel determined by the grayscale upper limit determiner 23.

Alternatively, when the color patch detector 23 determines that the detection area 110 is not the high saturation color patch 120, the grayscale upper limit determiner 23 is configured to set the first maximum grayscale of the W subpixel in each pixel 10 in the RGBW gamut in the detection area 110 to be equal to 255 or the maximum grayscale value allowed by the display device.

In this way, the grayscale upper limit determiner 23 may be adopted to define the upper limit W_L of the grayscale value of the W subpixel in the high saturation color patch 120, so as to avoid the reduction of the saturation of the high saturation color patch 120 and the reduction of the display effect of the image to be displayed corresponding to the RGBW gamut, which are due to too large brightness of the W subpixel.

The target grayscale determiner 24 is electrically connected with the grayscale upper limit determiner 23 and the grayscale value generator 21 and configured to at least take the minimum value of the first maximum grayscale W_lim1 and the preset grayscale value W1i as the target grayscale value Wt of the W subpixel, namely Wt=min(W_lim1, W1i).

The color gamut converter has the same technical effects with the color gamut conversion method provided by the foregoing embodiment, and no further description will be given here.

Figure 13:
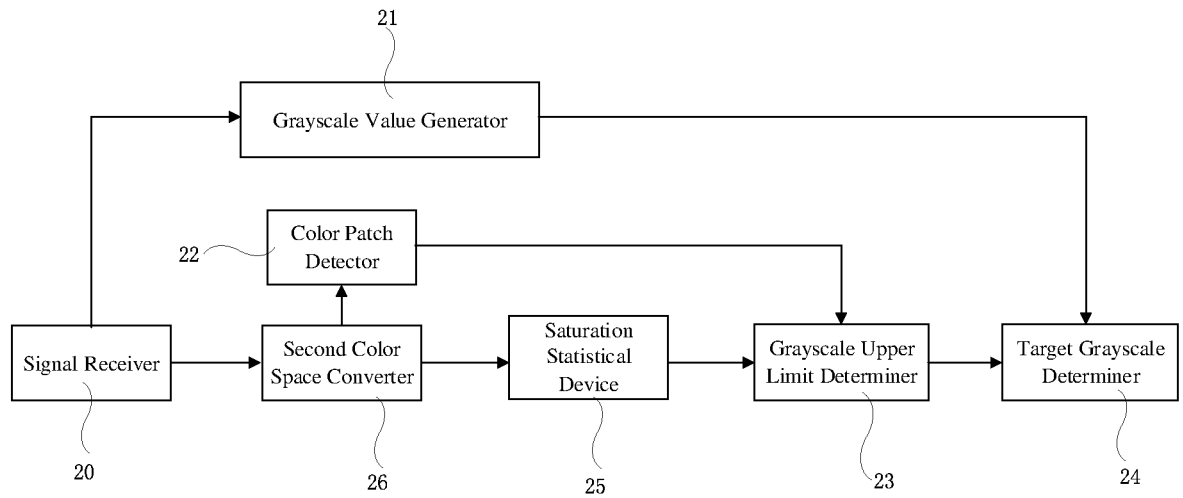
FIG. 13 is a schematic structural view of another color gamut converter provided by an embodiment of the present disclosure.

In order to further improve the display effect of the converted image, optionally, the color gamut converter, as illustrated in FIG. 12 or FIG. 13, also comprises a saturation statistical device 25.

The saturation statistical device 25 is electrically connected with the signal receiver 20 and configured to acquire the proportion K of subpixels in the original image, of which the saturations are greater than the preset saturation threshold S_th, in all the pixels of the original image 11. Moreover, the saturation statistical device 25 is further configured to take K×255 as the second maximum grayscale W_lim2 of the W subpixel in each pixel 10 in each RGBW gamut when the proportion K is greater than the second preset proportion parameter a2.

For example, in order to implement the statistical analysis of the saturations, when the color gamut converter comprises the second color space converter 26, the saturation statistical device 25 is connected with the second color space converter 26 and configured to receive hue (H), saturation (S) and brightness (V) data of each pixel 10 outputted by the second color space converter 26. In this case, the electrical connection between the saturation statistical device 25 and the signal receiver 20 indicates that the second color space converter 26 is disposed between the signal receiver 20 and the saturation statistical device 25, so that the signal receiver 20 can be electrically connected with the saturation statistical device 25 through the second color space converter 26.

In addition, as illustrated in FIG. 12, the saturation statistical device 25 may be directly electrically connected with the target grayscale determiner 24. The target grayscale determiner 24 is configured to take the minimum value of the first maximum grayscale W_lim1, the preset grayscale value W1i and the second maximum grayscale W_lim2 as the target grayscale value Wt of the W subpixel, namely Wt=min(W_lim1, W_lim2, W1i).

Alternatively, as illustrated in FIG. 13, the saturation statistical device 25 may be electrically connected with the target grayscale determiner 24 through the grayscale upper limit determiner 23. In this case, the minimum value of the first maximum grayscale W_lim1 outputted by the color gamut detector 22 and the second maximum grayscale W_lim2 outputted by the saturation statistical device 25 may be acquired at first through the grayscale upper limit determiner 23, that is, min(W_lim1, W_lim2) is taken as the grayscale upper limit W_L of the W subpixel determined by the grayscale upper limit determiner 23. Subsequently, the target grayscale determiner 24 is adopted to take the minimum value of the grayscale upper limit W_L of the W subpixel and the preset grayscale value W1i outputted by the grayscale value generator 21 as the target grayscale value Wt of the W subpixel.

Figure 14:
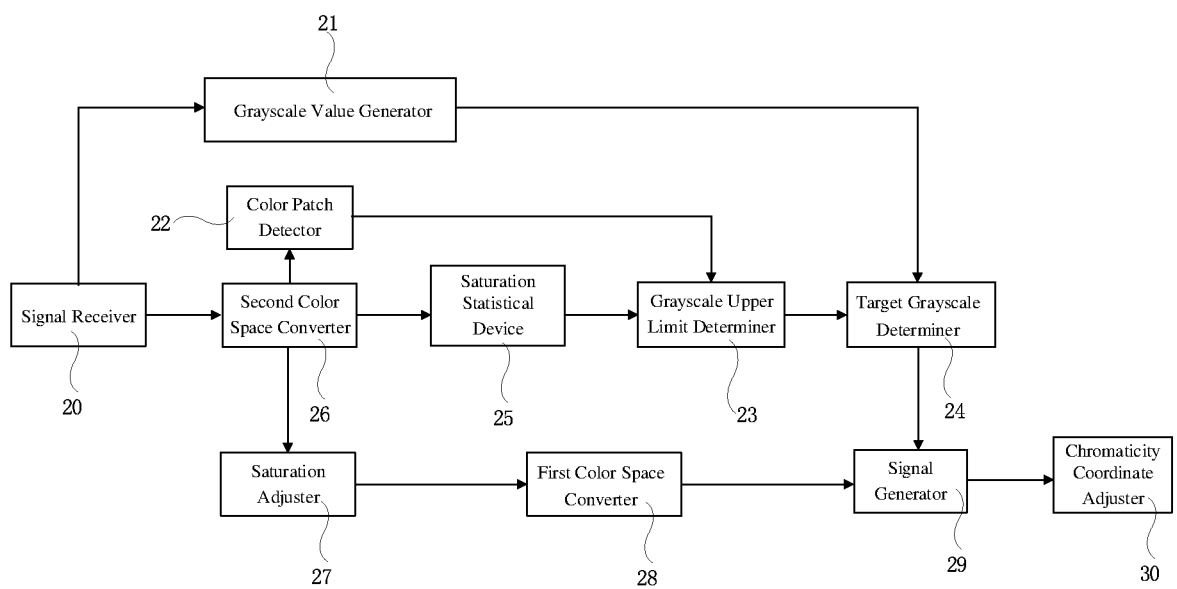
FIG. 14 is a schematic structural view of another color gamut converter provided by an embodiment of the present disclosure.

For example, after normalizing the saturation of the pixels 10 in the original image 11 outputted by the second color space converter 26, the color gamut converter, as illustrated in FIG. 14, may further comprise a saturation adjuster 27 and a first color space converter 28.

For example, the saturation adjuster 27 is electrically connected with the signal receiver 20. When the color gamut converter comprises the second color space converter 26, the saturation adjuster 27 may be electrically connected with the signal receiver 20 through the second color space converter 26. The saturation adjuster 27 is configured to adjust the saturation of any pixel 10 outputted by the second color space converter 26 to be the value of the saturation to α-order power. Here, 0<α<1.

For example, the α value can be set through the saturation adjuster 27, so as to slightly increase the saturation of each pixel 10 in the original image 11 as required.

For example, the first color space converter 28 is electrically connected with the saturation adjuster 27 and configured to acquire the grayscale values of the monochromatic subpixels (R, G, B) in each pixel 10 in the RGBW gamut according to the converted saturation of each pixel outputted by the saturation adjuster 27.

For example, the color gamut converter may further comprise a signal generator 29.

The signal generator 29 is electrically connected with the target grayscale determiner 24 and configured to splice, in the RGBW gamut, the target grayscale value of the W subpixel and the grayscale values of the monochromatic subpixels, which are in the pixel 10 same as the W subpixel, according to the distribution of the subpixels in the RGBW image to be displayed, and generate RGBW signals.

For example, the grayscale values of the monochromatic subpixels in the pixel 10 for generating the RGBW signals may be acquired according to the RGB signals outputted by the signal receiver 20. Alternatively, as illustrated in FIG. 14, when the color gamut converter comprises the first color space converter 28, the signal generator 29 may be electrically connected with the first color space converter 28, and then may receive the grayscale values of different monochromatic subpixels in the pixels 10 outputted by the first color space converter 28. In this case, the grayscale values of the monochromatic subpixels in the pixel 10 for generating the RGBW signals may be acquired based on signals outputted by the first color space converter 28.

For example, the color gamut converter may further comprise a chromaticity coordinate adjuster 30. The chromaticity coordinate adjuster 30 is electrically connected with the signal generator 29 and configured to adjust the chromaticity coordinate of the image to be displayed according to a chromaticity coordinate of a reference white pixel, so that the chromaticity coordinate D of the white pixel in the image to be displayed can be overlapped with the chromaticity coordinate of the reference white pixel, and then the display effect of the image to be displayed can satisfy user demands.

An embodiment of the present disclosure provides a display device, which comprises any foregoing color gamut converter. The display device has the same technical effects as the color gamut converter provided by the foregoing embodiment. No further description will be given here.

It should be noted that, in an embodiment of the present disclosure, the display device may be a liquid crystal display (LCD) device or an organic light-emitting diode (OLED) display device. Any foregoing display device may be any product or component with display function, such as a display, a television, a digital album, a mobile phone or a tablet computer.

Although detailed description has been given above to the present disclosure with general description and embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure.

What are described above is related to the illustrative embodiments of the disclosure only and not limitative to the scope of the disclosure; the scopes of the disclosure are defined by the accompanying claims.

What is claimed is:

1. A color gamut conversion method, comprising:
acquiring, by one or more processors, RGB signals;
acquiring, by the one or more processors, a preset grayscale value of a white subpixel in each pixel of a converted image according to grayscale values of monochromatic subpixels in each pixel of an original image corresponding to the RGB signals, wherein the converted image is obtained by converting the original image from an RGB gamut to an RGBW gamut; and
acquiring, by the one or more processors, a target grayscale value of the white subpixel at least according to a first maximum grayscale of the white subpixels and the preset grayscale value, and setting, by the one or more processors, the target grayscale value of the white subpixel to be a value that is less than or equal to a minimum value of the first maximum grayscale of the white subpixel and the preset grayscale value,
wherein, as for a first saturation color patch in the original image, a first maximum grayscale of a white subpixel corresponding to each pixel disposed in the first saturation color patch is equal to a grayscale threshold, and the grayscale threshold is less than a maximum grayscale value allowed by a display device.

2. The color gamut conversion method according to claim 1, wherein a first maximum grayscale of a white subpixel corresponding to each pixel, which is disposed in the original image and at outside of the first saturation color patch, is equal to the maximum grayscale value allowed by the display device; and the maximum grayscale value allowed by the display device is equal to 255, and the grayscale threshold is selected from 90-110.

3. The color gamut conversion method according to claim 1, further comprising:
dividing the original image into at least one detection area; and
determining whether a detection area of the at least one detection area is the first saturation color patch according to brightness, saturations and hues of a plurality of pixels in the each detection area.

4. The color gamut conversion method according to claim 3, wherein the dividing the original image into the at least one detection area and determining whether the detection area of the at least one detection area is the first saturation color patch according to the brightness, saturations and hues of the plurality of pixels in the detection area comprises:
setting a preset saturation threshold, a preset hue range, a preset brightness threshold and a first preset proportion parameter;
acquiring a proportion of pixels in the detection area, of which saturations are greater than the preset saturation threshold, hues are within the preset hue range, and brightness is greater than the preset brightness threshold, in all pixels of the original image; and
determining that the detection area is the first saturation color patch when the proportion of pixels in the detection area is greater than the first preset proportion parameter.

5. The color gamut conversion method according to claim 1, further comprising:
setting a second preset proportion parameter;
acquiring a proportion K of pixels in the original image, of which saturations are greater than the preset saturation threshold, in all the pixels of the original image, wherein K is a positive integer; and
setting a second maximum grayscale of the white subpixel to be K×255 when the proportion K is greater than the second preset proportion parameter,
wherein the acquiring the target grayscale value of the white subpixel at least according to the first maximum grayscale of the white subpixel and the preset grayscale value and setting the target grayscale value of the white subpixel to be a value that is less than or equal to the minimum value of the first maximum grayscale of the white subpixel and the preset grayscale value comprises: setting the target grayscale value of the white subpixel to be a minimum value of the first maximum grayscale, the preset grayscale value and the second maximum grayscale.

6. The color gamut conversion method according to claim 5, wherein before acquiring the proportion K of the pixels in the original image, of which the saturations are greater than the preset saturation threshold, in all the pixels of the original image, the method further comprises:
acquiring a saturation of each pixel of the original image and normalizing the saturation of the each pixel.

7. The color gamut conversion method according to claim 1, further comprising:
acquiring a grayscale value of red subpixel $R_{1i}$, a grayscale value of green subpixel $G_{1i}$, and a grayscale value of blue subpixel $B_{1i}$ of each pixel in the RGBW gamut according to a grayscale value of red subpixel $R_i$, a grayscale value of green subpixel $G_i$, and a grayscale value of blue subpixel $B_i$ of each pixel in the RGB gamut, wherein $R_i$, $R_{1i}$, $G_i$, $G_{1i}$, $B_i$ and $B_{1i}$ satisfy following formulas: $R_i=R_{1i}$; $G_i=G_{1i}$; $B_i=B_{1i}$.

8. The color gamut conversion method according to claim 7, wherein the acquiring the preset grayscale value of the white subpixel in the each pixel of the converted image according to the grayscale values of the monochromatic subpixels in the each pixel of the original image corresponding to the RGB signals comprises: acquiring the preset grayscale value $W_{1i}$ of the white subpixel according to a following formula:

$$W_{1i} = \frac{1}{3}(R_{1i} + G_{1i} + B_{1i}) \times \frac{\text{MIN}(R_{1i}, G_{1i}, B_{1i})}{\text{MAX}(R_{1i}, G_{1i}, B_{1i})}.$$

9. The color gamut conversion method according to claim 7, further comprising:
converting a saturation of the each pixel of the original image into a value of the saturation to α-order power, wherein 0<α<1; and
acquiring target grayscale values of monochromatic subpixels in the each pixel of the converted image according to the converted saturation of the each pixel.

10. The color gamut conversion method according to claim 7, wherein after acquiring the target grayscale value of the white subpixel, the method further comprises: splicing data corresponding to the target grayscale value of the white subpixel and data corresponding to target grayscale values of monochromatic subpixels in a pixel same as the white subpixel, and generating RGBW signals.

11. The color gamut conversion method according to claim 10, wherein after generating the RGBW signals, the method further comprises:
adjusting chromaticity coordinates of a converted image corresponding to the RGBW signals according to chromaticity coordinates of a reference white pixel, so as to make chromaticity coordinates of a white pixel be overlapped with the chromaticity coordinates of the reference white pixel.

12. A computer device, comprising a memory and a processor, wherein computer program instructions applicable to be executed by the processor are stored on the memory; and upon the processor running the computer program instructions, the processor executes the color gamut conversion method according to claim 1.

13. A non-transitory storage medium, comprising computer program instructions that are stored on the non-transitory storage medium; and upon a processor running the computer program instructions, a computer executes the color gamut conversion method according to claim 1.

14. A color gamut converter, comprising: a signal receiver, a grayscale value generator, a target grayscale determiner and a grayscale upper limit determiner,
wherein the signal receiver is configured to acquire RGB signals;
the grayscale value generator is electrically connected with the signal receiver and configured to acquire a preset grayscale value of a white subpixel in each pixel of a converted image according to grayscale values of monochromatic subpixels in each pixel of an original image corresponding to the RGB signals, wherein the converted image is obtained by converting the original image from an RGB gamut to an RGBW gamut;
the target grayscale determiner is electrically connected with the grayscale upper limit determiner and the grayscale value generator and configured to acquire a target grayscale value of the white subpixel at least according to a first maximum grayscale of the white subpixel and the preset grayscale value so as to set the target grayscale value of the white subpixel to be a value that is less than or equal to a minimum value of the first maximum grayscale and the preset grayscale value; and for a first saturation color patch in the original image, the grayscale upper limit determiner is configured to make a first maximum grayscale of a white subpixel corresponding to each pixel disposed in the first saturation color patch be equal to a grayscale threshold, wherein the grayscale threshold is less than a maximum grayscale value allowed by a display device.

15. The color gamut converter according to claim 14, wherein the grayscale upper limit determiner is further configured to make a first maximum grayscale of a white subpixel corresponding to each pixel, which is disposed in the original image and at outside of the first saturation color patch, be equal to the maximum grayscale value allowed by the display device; and the maximum grayscale value allowed by the display device is equal to 255, and the grayscale threshold is selected from 90-110.

16. The color gamut converter according to claim 14, further comprising a color patch detector, wherein the color patch detector is electrically connected with the grayscale value generator and configured to divide the original image into at least one detection area and determine whether a detection area of at least one detection area is the first saturation color patch according to the brightness, saturations and hues of a plurality of pixels in the detection area.

17. The color gamut converter according to claim 14, wherein the color gamut converter further comprises a saturation statistical device;

the saturation statistical device is electrically connected with the signal receiver;

the saturation statistical device is configured to acquire a proportion K of pixels in the original image, of which saturations are greater than a preset saturation threshold, in all pixels of the original image, and set a second maximum grayscale of the white subpixel in the each pixel in the RGBW gamut to be K×255 when the proportion K is greater than a second preset proportion parameter, wherein K is a positive integer;

the grayscale upper limit determiner is further connected with the saturation statistical device and configured to set a grayscale upper limit of the white subpixel to be a minimum value of the first maximum grayscale and the second maximum grayscale; and the target grayscale determiner is further connected with the grayscale upper limit determiner and configured to set the target grayscale value of the white subpixel to be a minimum value of the grayscale upper limit of the white subpixel and the preset grayscale value.

18. The color gamut converter according to claim 14, further comprising: a signal generator, a saturation adjuster and a first color space converter, wherein the saturation adjuster is electrically connected with the signal receiver and configured to adjust a saturation of the each pixel of the original image to be a value of the saturation to α-order power, wherein $0<\alpha<1$;

the first color space converter is electrically connected with the saturation adjuster and configured to acquire target grayscale value of monochromatic subpixels in the each pixel of the converted image according to a converted saturation, which is outputted by the saturation adjuster, of the each pixel;

the signal generator is electrically connected with the target grayscale determiner and configured to splice data corresponding to the target grayscale value of the white subpixel and data corresponding to target grayscale values of monochromatic subpixels in a pixel same as the white subpixel, and generate RGBW signals;

the color gamut converter further comprises a chromaticity coordinate adjuster; and the chromaticity coordinate adjuster is electrically connected with the signal generator and configured to adjust chromaticity coordinates of a converted image corresponding to the RGBW signals according to chromaticity coordinates of a reference white pixel, so as to make chromaticity coordinates of a white pixel in the converted image be overlapped with the chromaticity coordinates of the reference white pixel.

19. A display device, comprising the color gamut converter according to claim 14.

* * * * *